(12) United States Patent
Hwang

(10) Patent No.: US 9,834,855 B2
(45) Date of Patent: Dec. 5, 2017

(54) METHOD FOR MANUFACTURING MONOCRYSTALLINE GRAPHENE

(71) Applicant: KOREA RESEARCH INSTITUTE OF STANDARDS AND SCIENCE, Daejeon (KR)

(72) Inventor: Chanyong Hwang, Seoul (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 0 days.

(21) Appl. No.: 15/103,368

(22) PCT Filed: Dec. 26, 2014

(86) PCT No.: PCT/KR2014/012902
§ 371 (c)(1),
(2) Date: Jun. 10, 2016

(87) PCT Pub. No.: WO2015/102318
PCT Pub. Date: Jul. 9, 2015

(65) Prior Publication Data
US 2017/0009371 A1    Jan. 12, 2017

(30) Foreign Application Priority Data

Dec. 30, 2013  (KR) .................. 10-2013-0167109

(51) Int. Cl.
*C30B 25/02*  (2006.01)
*C30B 1/08*  (2006.01)
(Continued)

(52) U.S. Cl.
CPC ............ *C30B 1/08* (2013.01); *C01B 31/0453* (2013.01); *C01B 31/0484* (2013.01);
(Continued)

(58) Field of Classification Search
CPC ........ C30B 25/186; C30B 25/02; C30B 25/04
See application file for complete search history.

(56) References Cited

U.S. PATENT DOCUMENTS 9,284,640 B2 *  3/2016  Kula .................. C25D 5/48
9,358,048 B2 *  6/2016  Jensen ............... A61B 17/7064
(Continued)

FOREIGN PATENT DOCUMENTS

JP       2010-241680       10/2010
KR   10-2011-0140115 A   12/2011
(Continued)

OTHER PUBLICATIONS

Baraton, L. et al. On the Mechanisms of Precipitation of Graphene on Nickel Thin Films, A Letters Journal Exploring the Frontiers of Physics. Nov. 2011, vol. 96, Article No. 46003.
(Continued)

*Primary Examiner* — Robert M Kunemund
(74) *Attorney, Agent, or Firm* — Mayer & Williams PC; Stuart H. Mayer

(57) ABSTRACT

The present invention provides a method for manufacturing a monocrystalline graphene layer, comprising the steps of: forming polycrystalline graphene on a substrate by using a hydrocarbon gas to grow a graphene layer aligned on a wafer-scale insulator substrate in one direction like a monocrystal; forming a catalyst on the polycrystalline graphene; and recrystallizing the polycrystalline graphene to monocrystalline graphene by heat-treating the polycrystalline graphene and the catalyst.

12 Claims, 3 Drawing Sheets

(51) Int. Cl.
C23C 16/26 (2006.01)
C01B 31/04 (2006.01)
C30B 29/02 (2006.01)

(52) U.S. Cl.
CPC .............. *C23C 16/26* (2013.01); *C30B 29/02* (2013.01); *C01B 2204/20* (2013.01)

(56) References Cited

U.S. PATENT DOCUMENTS

| | | |
|---|---|---|
| 2009/0155561 A1 | 6/2009 | Choi et al. |
| 2012/0282489 A1 | 11/2012 | Shin et al. |
| 2014/0014030 A1* | 1/2014 | Tour ..................... C30B 25/186 117/97 |
| 2014/0178688 A1* | 6/2014 | Tour ................... C01B 31/0453 428/408 |

FOREIGN PATENT DOCUMENTS

| | | |
|---|---|---|
| KR | 10-2012-0099917 A | 9/2012 |
| KR | 10-2013-0000964 A | 1/2013 |

OTHER PUBLICATIONS

Baraton et al., "On the mechanisms of precipitation of graphene on nickel thin films" Europhysics Letters: A Letters Journal Exploring the Frontiers of Physics, Institute of Physics Publishing, Bristol France, vol. 96, No. 4, Nov. 1, 20111 pp. 1-6.

* cited by examiner

METHOD FOR MANUFACTURING MONOCRYSTALLINE GRAPHENE

TECHNICAL FIELD

The present invention relates to a method of producing graphene and, more particularly, to a method of producing monocrystalline graphene.

BACKGROUND ART

Graphene refers to a two-dimensional thin layer with honeycomb structure, comprising one or more layers of carbon atoms. When the carbon atoms are chemically bonded due to an $sp^2$ hybrid orbital, a two-dimensional plane of a hexagonal carbon mesh is provided. Carbon has four outermost electrons, and the four electrons are hybridized to participate in bonding. A method of bonding carbon atoms includes $sp^3$ bonding and $sp^2$ bonding. Carbon atoms bonded using only $sp^3$ bonding correspond to a diamond having a square shape, and carbon atoms bonded using only $sp^2$ bonding correspond to graphite or graphene, a layer of graphite. For example, electrons which should be present in an s orbital and a p orbital have an $sp^2$ or $sp^3$ hybrid orbital corresponding to a combination of the s and p orbitals. The $sp^2$ hybrid orbital has one electron in the s orbital and two electrons in the p orbital, and thus has a total of three electrons. In this case, the electrons have equal energy levels. Having the hybrid orbital is more stable compared to separately having the s and p orbitals. An aggregate of carbon atoms having a planar structure due to $sp^2$ bonding is graphene, and the thickness of a monolayer thereof corresponds to the size of one carbon atom, e.g., about 0.3 nm. Graphene has properties of metal. For example, graphene has conductivity in a layer direction, has excellent thermal conductivity, and has a high mobility of charge carriers, and thus may be used to implement a high-speed electronic device. It is known that electron mobility of a graphene sheet has a value of about 20,000 to 50,000 $cm^2/Vs$.

Since a research group of the University of Manchester, UK has published a method of producing a thin carbon layer having a thickness of one atom, from graphite in 2005, graphene has become one of the most attractive study items in physics because research can be conducted on the unique quantum-Hall effect of graphene and conventionally impossible particle physics experiments can be indirectly implemented using graphene based on a fact that electrons have no effective mass in graphene and thus behave as relativistic particles moving at 1,000 km per sec. (1/300 of the speed of light).

Using a conventional silicon-based semiconductor process technology, a highly-integrated semiconductor device having a thickness equal to or less than 30 nm may not be easily manufactured because atoms of metal, e.g., gold (Au) or aluminum (Al), deposited on a substrate are thermodynamically unstable, stuck to each other, and thus incapable of obtaining a uniform thin layer if the thickness of the layer thereof is equal to or less than 30 nm, and because the density of impurities doped on silicon is not uniform at the above-mentioned nano-size. However, graphene has a possibility of solving the restriction in integration of the silicon-based semiconductor device technology. Graphene has properties of metal, has a thickness equal to or less than several nm corresponding to an electron shielding thickness, and thus has an electric resistance which varies due to a charge density changed depending on a gate voltage. Using the above characteristics, a metal transistor may be implemented. Furthermore, due to a high mobility of charge carriers, a high-speed electronic device may be implemented. In addition, charges of the charge carriers may be changed from electrons to holes depending on the polarity of the gate voltage, and application to a variety of fields may be expected.

Currently, a method of obtaining graphene is classified into the following three.

The first method is a micro cleavage method using cellophane tape. This method has been developed by a research team of the University of Manchester, UK, and researchers use this method due to simplicity thereof. In this method, the thickness of graphite may be reduced by repeatedly peeling graphite using cellophane tape, and a thin graphite layer obtained as described above is transferred onto a substrate. Alternatively, a thin graphite layer is obtained by rubbing graphite on a substrate like rubbing chalk on a blackboard. However, this method depends on the quality of the adhesive tape, and electrodes may not be easily patterned using electron-beam lithography due to a large number of useless and thick graphite particles.

The second method is a method of epitaxially growing graphene by pyrolyzing silicon carbide (SiC) under high vacuum. This epitaxial growth method is a method of producing graphene using carbon atoms remaining on the surface of SiC after silicon is sublimated from the surface at high vacuum and high temperature, e.g., in a molecular beam epitaxy (MBE) system. In this technology, SiC should be used as a substrate. However, this substrate does not have good performance to be used as an electronic material.

The third method is a method using chemical peeling of a graphite compound. However, in this method, only a piece of graphite having a thickness of several hundred nanometers may be obtained and graphene may not be obtained. In addition, a chemical material inserted between graphite layers may not be completely removed and thus a large number of defects may be caused.

The fourth method is a method of growing graphene on a metal substrate using chemical vapor deposition (CVD). However, in this method, graphene may not be oriented in a direction due to growth characteristics thereof. The largest obstacle to commercialization of graphene electronic devices is not a fact that a bandgap may not be easily provided due to material characteristics and thus a logic circuit may not be easily configured, but is a fact that a large-area single crystal, e.g., silicon, may not be easily found. It is currently known that initial uniformity of a graphene layer is controllable by growing graphene on almost melted liquid-state copper. However, even in this case, directivities are not equal and thus growing of a large-area graphene single crystal is impossible. A new idea for producing monocrystalline graphene is required to newly develop electronic devices using graphene.

DETAILED DESCRIPTION OF THE INVENTION

Technical Problem

The present invention provides a method of growing a graphene layer oriented in a direction, e.g., a monocrystalline graphene layer, on a wafer-scale insulating substrate. However, the scope of the present invention is not limited thereto.

Technical Solution

According to an aspect of the present invention, there is provided a method of manufacturing monocrystalline graphene, the method including forming polycrystalline graphene on a substrate using a hydrocarbon gas, forming a catalyst on the polycrystalline graphene, and recrystallizing the polycrystalline graphene into monocrystalline graphene by heat-treating the polycrystalline graphene and the catalyst.

The substrate may be an insulating substrate including $Al_2O_3$, AlN, $Si_3N_4$, $SrTiO_3$, or BN. Alternatively, the substrate may be a composite substrate obtained by growing a transition metal including copper (Cu) or nickel (Ni) in a form of a thin layer having a thickness of 0.5 μm to 3 μm, on the insulating substrate. The monocrystalline graphene may include monocrystalline graphene grown on the substrate.

The substrate may be a metal substrate including tungsten (W) or molybdenum (Mo).

The substrate may include a wafer-scale substrate.

The forming of the polycrystalline graphene on the substrate using the hydrocarbon gas may be performed at a temperature of 600° C. to 1100° C.

The catalyst may include aluminum (Al), an Al-containing compound, or a 3d transition metal compound.

The recrystallizing of the polycrystalline graphene into the monocrystalline graphene by heat-treating the polycrystalline graphene and the catalyst may be performed at a temperature of 1400° C. to 2000° C.

The heat-treating may include heating a first part of the polycrystalline graphene and the catalyst using a local heat source, and moving the local heat source to another location to cool the first part and to heat a second part at the same time. The heat-treating may be performed by moving the local heater in a direction from one side to the other side of the substrate.

Advantageous Effects

According to an embodiment of the present invention, a method of growing a graphene layer oriented in a direction, e.g., a monocrystalline graphene layer, on a wafer-scale insulating substrate may be provided. According to an embodiment of the present invention, by growing a graphene layer oriented in a direction, e.g., a monocrystalline graphene layer, on a wafer-scale insulator, graphene electronic devices may be commercialized and thus may lead the post-silicon era. However, the scope of the present invention is not limited to the above-described effect.

MODE OF THE INVENTION

Figure 1:
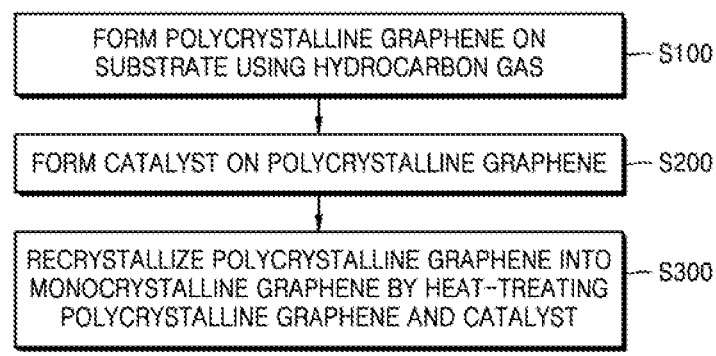
FIG. 1 is a flowchart of a method of producing a monocrystalline graphene layer, according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements are exaggerated for convenience of explanation.

Figure 2:
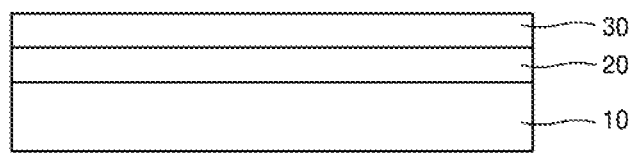
FIGS. 2 and 3 are sequential cross-sectional views for describing the method of producing the monocrystalline graphene layer, according to an embodiment of the present invention.
Figure 3:
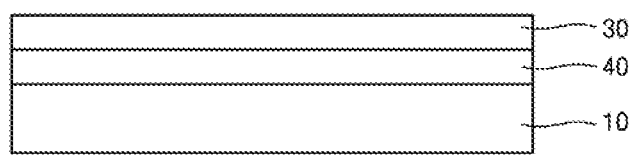

FIG. 1 is a flowchart of a method of producing a monocrystalline graphene layer, according to an embodiment of the present invention, and FIGS. 2 and 3 are sequential cross-sectional views for describing the method of producing the monocrystalline graphene layer, according to an embodiment of the present invention.

Referring to FIGS. 1 to 3, the method of producing the monocrystalline graphene layer, according to an embodiment of the present invention includes forming polycrystalline graphene 20 on a substrate 10 using a hydrocarbon gas (S100), forming a catalyst 30 on the polycrystalline graphene 20 (S200), and recrystallizing the polycrystalline graphene 20 into monocrystalline graphene 40 by heat-treating the polycrystalline graphene 20 and the catalyst 30 (S300).

In the forming of the polycrystalline graphene 20 on the substrate 10 using the hydrocarbon gas (S100), the substrate 10 may be an insulating substrate including $Al_2O_3$, AlN, $Si_3N_4$, $SrTiO_3$, or BN. Alternatively, the substrate 10 may be a composite substrate obtained by growing transition metal including copper (Cu) or nickel (Ni) in the form of a thin layer having a thickness of 0.5 μm to 3 μm, on an insulator (e.g., an insulating substrate including $Al_2O_3$, AlN, $Si_3N_4$, $SrTiO_3$, or BN). In this case, the monocrystalline graphene 40 may include monocrystalline graphene grown on the insulating substrate or the composite substrate. In the method of producing the monocrystalline graphene layer, according to a modified embodiment of the present invention, the substrate 10 may be a metal substrate including tungsten (W) or molybdenum (Mo). In embodiments of the present invention, the substrate 10 may include a wafer-scale substrate. The hydrocarbon gas may include, for example, methyl, methane, ethane, ethylene, acetylene, propane, propylene, butane, butadiene, pentane, or hexane. In the method of producing the monocrystalline graphene layer, according to an embodiment of the present invention, the forming of the polycrystalline graphene 20 on the substrate 10 using the hydrocarbon gas (S100) may be performed at a temperature of about 600° C. to 1100° C.

In the method of producing the monocrystalline graphene layer, according to an embodiment of the present invention, in the forming of the catalyst 30 on the polycrystalline graphene 20 (S200), the catalyst 30 may include aluminum (Al), an Al-containing compound, or a 3d transition metal compound. The 3d transition metal may include, for example, titanium (Ti), vanadium (V), chromium (Cr), manganese (Mn), iron (Fe), cobalt (Co), nickel (Ni), or copper (Cu). For example, the Al-containing compound or the 3d transition metal compound may be $Al_4C_3$, $KAl_2(AlSi_3)O_{10}(OH)_2$, Cu, Ni, Co, Mn, CaO, $CrCl_2 \cdot 6H_2O$, $Cr_3C_2$, CrS, $CuF_2$, $CuSiF_6$, CuO, or CuCl. The present inventor has prepared the catalyst 30 by depositing Al, the Al-containing compound, or the 3d transition metal compound to a very low coverage, or by adsorbing a precursor including the same using chemical vapor deposition (CVD) or atomic layer deposition (ALD), and has found that monocrystalline graphene may be grown on the insulating substrate or the composite substrate using the above-described catalyst 30.

In the method of producing the monocrystalline graphene layer, according to an embodiment of the present invention, the recrystallizing of the polycrystalline graphene 20 into the monocrystalline graphene 40 by heat-treating the polycrystalline graphene 20 and the catalyst 30 (S300) may be performed at a temperature of about 1400° C. to 2000° C. The heat-treating may be performed not by increasing the temperature of a whole sample at once but by moving a heater to increase the temperature of a part of the sample and then scanning the temperature-increased part in a direction. A description thereof is now given with reference to the drawings.

Figure 4:
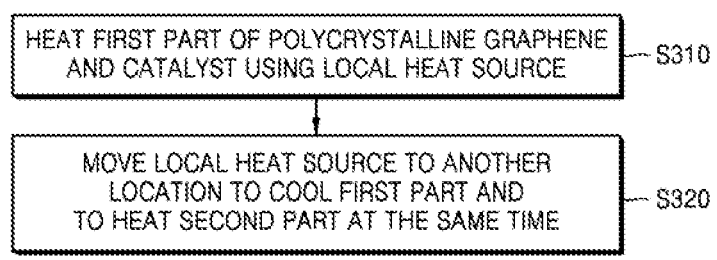
FIG. 4 is a flowchart of a recrystallizing process in the method of producing the monocrystalline graphene layer, according to an embodiment of the present invention.
Figure 5:
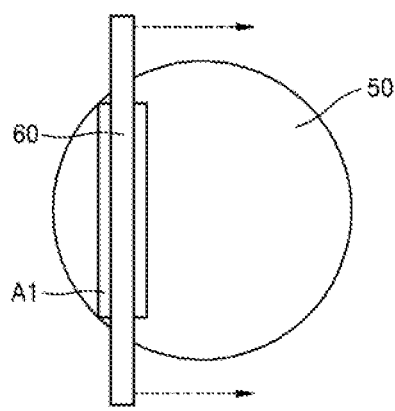
FIGS. 5 and 6 are sequential plan views for describing the recrystallizing process in the method of producing the monocrystalline graphene layer, according to an embodiment of the present invention.
Figure 6:
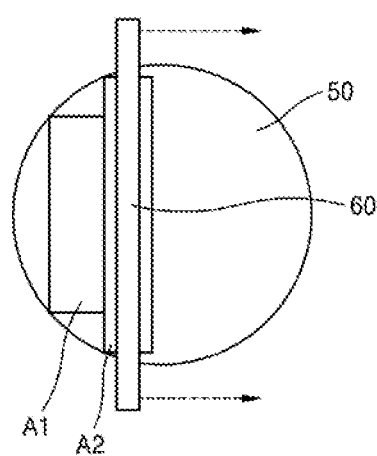

FIG. 4 is a flowchart of a recrystallizing process in the method of producing the monocrystalline graphene layer, according to an embodiment of the present invention, and FIGS. 5 and 6 are sequential plan views for describing the recrystallizing process in the method of producing the monocrystalline graphene layer, according to an embodiment of the present invention.

The recrystallizing of the polycrystalline graphene 20 into the monocrystalline graphene 40 by heat-treating the polycrystalline graphene 20 and the catalyst 30 (S300) may include heating a first part A1 of a sample 50 including the polycrystalline graphene 20 and the catalyst 30, using a local heater 60 (S310), and moving the local heater 60 to another location to cool the first part A1 and to heat a second part A2 of the sample 50 (S320). The heat-treating may be performed by moving the local heater 60 in a direction from a side to another side of the substrate 10 included in the sample 50 (e.g., in a direction from a left side to a right side of FIGS. 5 and 6). The second part A2 may be a part adjacent to the first part A1 in the direction in which the local heater 60 moves from the first part A1.

The method of producing the monocrystalline graphene layer, according to an embodiment of the present invention has been described above with reference to the drawings.

The present invention does not disclose a method of directly growing monocrystalline graphene using a hydrocarbon gas, but discloses a multistage method of growing polycrystalline graphene on a substrate using a hydrocarbon gas, forming a catalyst on the polycrystalline graphene, and then recrystallizing the polycrystalline graphene into monocrystalline graphene by heat-treating the polycrystalline graphene and the catalyst using a zone heating scheme. The heat-treating may be understood as post annealing.

One of factors considered to produce a monocrystalline graphene layer is temperature. A temperature for producing bulk graphite is equal to or greater than about 2500K in consideration of the size of carbon atoms and bonding between carbon atoms. Compared to the bulk, a monolayer has a larger space in which carbon atoms move, and thus a temperature for producing the same may be lower than 2500K. To obtain a single crystal, different grains should be re-boned to be oriented in a direction, and thus a temperature for producing the same may be in a range of about 1400K to 2000K. At this temperature, a metal substrate including, for example, tungsten (W) or molybdenum (Mo) having a high melting point should be used. The solubility of carbon atoms of the metal at this temperature is far apart from the melting point, and thus graphene may be produced due to surface reaction of hydrocarbon. In some embodiments of the present invention, graphene may be grown using a ceramic substrate capable of growing a thin layer at high temperature (e.g., an insulating substrate including $Al_2O_3$, AlN, $Si_3N_4$, $SrTiO_3$, or BN). In this case, a semiconductor device or an electronic device may be manufactured without transferring the grown graphene to another substrate.

In the method of producing the monocrystalline graphene layer, according to an embodiment of the present invention, reaction energy may be lowered by utilizing catalyst reaction using organic and inorganic materials to reduce the temperature of recrystallization. The present inventor has found that the process temperature may be lowered to 1800K or below if Al or a 3d transition metal compound is used as a catalyst. The present inventor has also found that efficient recrystallization may be achieved not by increasing the temperature of a whole sample at once but by moving a heater to increase the temperature of a part of the sample and then scanning the temperature-increased part in a direction. That is, recrystallization is induced not by heating the whole sample but by performing a zone heating process to heat an edge of a substrate and then to move a heater in a direction, and thus graphene monocrystalline is grown on the insulating substrate or the composite substrate.

While the present invention has been particularly shown and described with reference to embodiments thereof, it will be understood by one of ordinary skill in the art that various changes in form and details may be made therein without departing from the spirit and scope of the present invention as defined by the following claims.

The invention claimed is:

1. A method of manufacturing monocrystalline graphene, the method comprising:
   forming polycrystalline graphene on a substrate using a hydrocarbon gas;
   forming a catalyst on the polycrystalline graphene; and
   recrystallizing the polycrystalline graphene into monocrystalline graphene by heat-treating the polycrystalline graphene and the catalyst.

2. The method of claim 1, wherein the substrate is an insulating substrate comprising Al2O3, AlN, Si3N4, SrTiO3, or BN.

3. The method of claim 2, wherein the substrate is a composite substrate obtained by growing a transition metal having a thickness of 0.5 μm to 3 μm, on the insulating substrate.

4. The method of claim 2, wherein the monocrystalline graphene comprises monocrystalline graphene grown on the substrate.

5. The method of claim 1, wherein the substrate is a metal substrate comprising tungsten (W) or molybdenum (Mo).

6. The method of claim 1, wherein the substrate comprises a wafer-scale substrate.

7. The method of claim 1, wherein the forming of the polycrystalline graphene on the substrate using the hydrocarbon gas is performed at a temperature of 600° C. to 1100° C.

8. The method of claim 1, wherein the catalyst comprises aluminum (Al), an Al-containing compound, or a 3d transition metal compound.

9. The method of claim 8, wherein the recrystallizing of the polycrystalline graphene into the monocrystalline graphene by heat-treating the polycrystalline graphene and the catalyst is performed at a temperature of 1400° C. to 2000° C.

10. The method of claim 1, wherein the heat-treating comprises:
    heating a first part of the polycrystalline graphene and the catalyst using a local heat source; and
    moving the local heat source to another location to cool the first part and to heat a second part at the same time.

11. The method of claim 10, wherein the heat-treating is performed by moving the local heat source in a direction from one side to the other side of the substrate.

12. The method of claim 3, wherein the monocrystalline graphene comprises monocrystalline graphene grown on the substrate.

\* \* \* \* \*